United States Patent
Otsuka et al.

(10) Patent No.: US 11,655,394 B2
(45) Date of Patent: May 23, 2023

(54) POLISHING SOLUTION AND POLISHING METHOD

(71) Applicant: HITACHI CHEMICAL COMPANY, LTD., Tokyo (JP)

(72) Inventors: Yuya Otsuka, Tokyo (JP); Tomohiro Iwano, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 321 days.

(21) Appl. No.: 16/636,816

(22) PCT Filed: Aug. 9, 2017

(86) PCT No.: PCT/JP2017/028956
§ 371 (c)(1),
(2) Date: Feb. 5, 2020

(87) PCT Pub. No.: WO2019/030865
PCT Pub. Date: Feb. 14, 2019

(65) Prior Publication Data
US 2020/0369917 A1 Nov. 26, 2020

(51) Int. Cl.
*C09G 1/02* (2006.01)
*B24B 37/04* (2012.01)

(52) U.S. Cl.
CPC ............. *C09G 1/02* (2013.01); *B24B 37/044* (2013.01)

(58) Field of Classification Search
None
See application file for complete search history.

(56) References Cited

U.S. PATENT DOCUMENTS

| | | | |
|---|---|---|---|
| 4,944,836 A | 7/1990 | Beyer et al. | |
| 6,440,856 B1* | 8/2002 | Bessho | B08B 3/08 438/692 |
| 10,899,945 B2* | 1/2021 | Reichardt | C09G 1/06 |
| 2003/0170991 A1* | 9/2003 | Wang | C09G 1/02 438/692 |
| 2008/0070412 A1* | 3/2008 | Yoshida | C09G 1/02 438/693 |
| 2012/0028467 A1* | 2/2012 | Kamimura | H01L 21/31053 438/693 |
| 2012/0094491 A1* | 4/2012 | Kanamaru | C09K 3/1472 438/693 |
| 2015/0111383 A1* | 4/2015 | Miura | H01L 21/02024 438/693 |
| 2015/0232704 A1* | 8/2015 | Akutsu | H01L 21/76224 252/79.1 |
| 2015/0299517 A1* | 10/2015 | Matsushita | C09K 3/1409 252/79.1 |
| 2015/0344738 A1* | 12/2015 | Onishi | B24B 37/044 438/692 |
| 2015/0376461 A1* | 12/2015 | Grumbine | C09K 3/1454 252/79.1 |
| 2015/0376463 A1* | 12/2015 | Fu | H01L 21/31055 438/693 |
| 2016/0222254 A1* | 8/2016 | Huang | H01L 21/304 |
| 2017/0081552 A1* | 3/2017 | Yamato | H01L 21/32115 |
| 2017/0136600 A1* | 5/2017 | Shinoda | H01L 21/31053 |
| 2017/0210958 A1* | 7/2017 | Shinoda | C09K 3/1463 |

FOREIGN PATENT DOCUMENTS

| | | |
|---|---|---|
| JP | 2016-531429 A | 10/2016 |
| JP | 6028046 B2 | 11/2016 |
| KR | 10-2013-0029441 A | 3/2013 |
| TW | 201113358 A | 4/2011 |

* cited by examiner

*Primary Examiner* — Shamim Ahmed
(74) *Attorney, Agent, or Firm* — Fitch, Even, Tabin & Flannery, LLP

(57) ABSTRACT

Polishing liquid comprising abrasive grains, a phosphonic acid compound having a molecular weight of 210 or more, and at least one selected from the group consisting of amino acids and amino acid derivatives, in which a silanol group density of the abrasive grains is 6.5 groups/nm² or less, and a degree of association of the abrasive grains is 1.5 or more.

12 Claims, No Drawings

POLISHING SOLUTION AND POLISHING METHOD

CROSS-REFERENCE TO RELATED APPLICATIONS

This application is a U.S. national phase application filed under 35 U.S.C. § 371 of International Application No. PCT/JP2017/028956, filed Aug. 9, 2017, designating the United States, which is hereby incorporated herein by reference in its entirety.

TECHNICAL FIELD

The present invention relates to a polishing liquid and a polishing method. The present invention relates to a polishing liquid and a polishing method that can be used for polishing in, for example, a wiring formation process of a semiconductor substrate.

BACKGROUND ART

In recent years, along with the progress in integration and functionality of semiconductor integrated circuits (hereinafter, referred to as "LSI"), new microfabrication techniques have been developed. A chemical mechanical polishing (hereinafter, referred to as "CMP") method is one of such techniques, and is a technique that is frequently used in LSI manufacturing processes (in particular, flattening of interlayer insulating films, formation of metal plugs, or formation of buried wiring in multilayer wiring formation processes). This technique is disclosed, for example, in Patent Literature 1 described below.

CMP has been applied to each process in semiconductor production, and as an embodiment thereof, for example, application to a gate formation step in transistor fabrication is exemplified. At the time of transistor fabrication, materials such as a metal, silicon, silicon oxide, silicon nitride, and polycrystalline silicon (polysilicon) may be polished, and depending on a transistor structure, a polishing rate of each material is required to be controlled.

In this case, as one of problems, in polishing of a surface to be polished containing silicon dioxide, silicon nitride, and polysilicon, there is a demand for polishing silicon nitride and polysilicon non-selectively with respect to silicon dioxide. Herein, the term "non-selectively" means that silicon nitride and polysilicon are not polished selectively with respect to silicon dioxide and means that polishing rates of silicon nitride and polysilicon are similar to a polishing rate of silicon dioxide.

As abrasive grains used in the case of polishing silicon dioxide, silicon nitride, and polysilicon, ceria particles and silica particles are generally known.

Patent Literature 2 described below discloses that silicon dioxide, silicon nitride, and polysilicon are simultaneously polished using a polishing liquid containing colloidal ceria particles (ceria particles) and a quaternary methacryloyl alkyl ammonium polymer (cationic polymer).

Patent Literature 3 described below discloses that a polishing rate of silicon nitride is improved by using silica particles in which a sulfonic acid is immobilized on the abrasive grain surface to have a negative zeta potential.

CITATION LIST

Patent Literature

Patent Literature 1: U.S. Pat. No. 4,944,836
Patent Literature 2: Japanese Unexamined Patent Publication No. 2016-531429
Patent Literature 3: Japanese Patent No. 6028046

SUMMARY OF INVENTION

Technical Problem

However, in the case of using ceria particles, since ceria has high reactivity with silicon dioxide, a polishing rate of silicon dioxide is excessively higher than polishing rates of silicon nitride and polysilicon, and silicon nitride and polysilicon are difficult to be polished non-selectively with respect to silicon dioxide while both the polishing rates of silicon nitride and polysilicon are also increased.

Further, even in a case where the polishing rate of silicon nitride is improved when silica particles are used, silicon nitride and polysilicon are difficult to be polished non-selectively with respect to silicon dioxide while the polishing rates of silicon dioxide, silicon nitride, and polysilicon are controlled.

The present invention is made to solve the above-described problems, and an object thereof is to provide a polishing liquid and a polishing method which are capable of polishing silicon nitride and polysilicon non-selectively with respect to silicon dioxide.

Solution to Problem

The present inventor has conducted various studies in order to solve the above-described problems, and as a result, has found that a combination of specific abrasive grains and specific additives is an important factor.

A polishing liquid of the present invention contains abrasive grains, a phosphoric acid compound having a molecular weight of 210 or more, and at least one selected from the group consisting of amino acids and amino acid derivatives, in which a silanol group density of the abrasive grains is 6.5 groups/nm$^2$ or less, and a degree of association of the abrasive grains is 1.5 or more.

According to the polishing liquid of the present invention, silicon nitride and polysilicon can be polished non-selectively with respect to silicon dioxide. According to the polishing liquid of the present invention, it is possible to polish a surface to be polished containing silicon dioxide, silicon nitride, and polysilicon while flattening.

The abrasive grains preferably contain colloidal silica. A zeta potential of the abrasive grain is preferably positive.

A pH of the polishing liquid of the present invention is preferably 2.0 to 5.0.

The polishing liquid of the present invention may be used for polishing a surface to be polished containing silicon dioxide, silicon nitride, and poly silicon.

In the polishing liquid of the present invention, a ratio of polishing rates of silicon nitride and polysilicon with respect to a polishing rate of silicon dioxide (polishing rates of silicon nitride and polysilicon/polishing rate of silicon dioxide) is preferably 0.80 to 1.20 and more preferably 0.80 or more and less than 1.20.

A polishing method of the present invention includes a step of polishing a surface to be polished containing silicon dioxide, silicon nitride, and polysilicon using the aforementioned polishing liquid.

Advantageous Effects of Invention

According to the present invention, silicon nitride and polysilicon can be polished non-selectively with respect to silicon dioxide. According to the present invention, when the polishing rate of silicon dioxide is set to 1.00, the polishing rate of 0.80 to 1.20 can be obtained as the polishing rates of silicon nitride and polysilicon. According to the present invention, it is possible to polish a surface to be polished containing silicon dioxide, silicon nitride, and polysilicon while flattening. According to the present invention, it is possible to provide an application of a polishing liquid to polishing of a surface to be polished containing silicon dioxide, silicon nitride, and polysilicon.

DESCRIPTION OF EMBODIMENTS

Hereinafter, embodiments of the present invention will be described in detail.

<Definition>

In the present specification, a numerical range that has been indicated by use of "to" indicates the range that includes the numerical values which are described before and after "to", as the minimum value and the maximum value, respectively. In the numerical ranges that are described stepwise in the present specification, the upper limit value or the lower limit value of the numerical range of a certain stage can be arbitrarily combined with the upper limit value or the lower limit value of the numerical range of another stage. In the numerical ranges that are described in the present specification, the upper limit value or the lower limit value of the numerical value range may be replaced with the value shown in the examples. "A or B" may include either one of A and B, and may also include both of A and B. Materials listed as examples in the present specification can be used singly or in combinations of two or more, unless otherwise specifically indicated.

In the present specification, when a plurality of substances corresponding to each component exist in the composition, the content of each component in the composition means the total amount of the plurality of substances that exist in the composition, unless otherwise specified.

<Polishing Liquid>

A polishing liquid of the present embodiment contains abrasive grains, a phosphonic acid compound having a molecular weight of 210 or more, and at least one amino acid component selected from the group consisting of amino acids and amino acid derivatives, in which a silanol group density of the abrasive grains is 6.5 groups/nm$^2$ or less, and a degree of association of the abrasive grains is 1.5 or more. The polishing liquid of the present embodiment can be used as a CMP polishing liquid. The polishing liquid of the present embodiment can be used to polish a surface to be polished containing silicon dioxide and at least one selected from the group consisting of silicon nitride and polysilicon, and can also be used for polishing a surface to be polished containing silicon dioxide, silicon nitride, and polysilicon.

According to the polishing liquid of the present embodiment, silicon nitride and polysilicon can be polished non-selectively with respect to silicon dioxide. The reason why such an effect is exhibited is not necessarily clear, but the present inventors assume in the following way. That is, in the presence of the phosphonic acid compound having the above-described specific molecular weight and the amino acid component, the phosphonic acid compound is easily coordinated on the silicon nitride surface and the amino acid component is easily coordinated on the polysilicon surface. Further, when the respective compounds are coordinated, wettability of the surface to be polished changes and the abrasive grains having a low silanol group density easily act on the surface to be polished. Further, since the abrasive grains having a large degree of association have a large surface area, such an effect is easily exhibited. From the above reasons, the polishing rates of silicon nitride and polysilicon are improved up to the similar polishing rate as the polishing rate of silicon dioxide.

(Abrasive Grains)

The polishing liquid of the present embodiment contains abrasive grains. Examples of materials of the abrasive grains include silica, alumina, and cerin. From the viewpoint of easily polishing silicon nitride and polysilicon non-selectively with respect to silicon dioxide, the abrasive grains preferably contain silica and more preferably contain colloidal silica.

The upper limit of the silanol group density of the abrasive grains is 6.5 groups/nm$^2$ or less, from the viewpoint of polishing silicon nitride and polysilicon non-selectively with respect to silicon dioxide. The upper limit of the silanol group density of the abrasive grains is preferably 5.0 groups/nm$^2$ or less, more preferably 4.2 groups/nm$^2$ or less, further preferably 4.0 groups/nm$^2$ or less, particularly preferably 3.0 groups/nm$^2$ or less, extremely preferably 2.0 groups/nm$^2$ or less, very preferably 1.7 groups/nm$^2$ or less, and even more preferably 1.6 groups/nm$^2$ or less, from the viewpoint of easily polishing silicon nitride and polysilicon non-selectively with respect to silicon dioxide. The lower limit of the silanol group density of the abrasive grains is preferably 1.0 group/nm$^2$ or more, more preferably 1.1 groups/nm$^2$ or more, further preferably 1.2 groups/nm$^2$ or more, particularly preferably 1.4 groups/nm$^2$ or more, and extremely preferably 1.5 groups/nm$^2$ or more, from the viewpoint of easily polishing silicon nitride and polysilicon non-selectively with respect to silicon dioxide.

The silanol group density ($\rho$ [groups/nm$^2$]) can be measured and calculated by the following titration. First, 15 g of particles (A [g]) are weighed and dispersed in an appropriate amount (100 ml or less) of water, Next, pH is adjusted to 3.0 to 3.5 with 0.1 mol/l of hydrochloric acid. Thereafter, after adding 30 g of sodium chloride, ultrapure water is further added to adjust the total amount to 150 g. Next, pH is adjusted to 4.0 with 0.1 mol/l of sodium hydroxide solution to obtain a sample for titration. 0.1 mol/l of sodium hydroxide solution is added dropwise to the sample for titration until the pH becomes 9.0, an amount (B [mol]) of sodium hydroxide required until the pH becomes 9.0 from 4.0 is obtained, and then the silanol group density is calculated by the following Formula (1).

$$\rho = B \cdot N_A / A \cdot S_{BET} \quad (1)$$

[in the formula, $N_A$ (unit: molecules/mol) represents Avogadro's number, and $S_{BET}$ (unit: m$^2$/g) represents a BET specific surface area. A method of measuring the BET specific surface area will be described below.]

In the case of silica particles, which can be obtained in a state of being dispersed in a medium such as water, such as colloidal silica, an amount in which the amount of silica particles (A [g]) is weighed to be 15 g, and the silanol group density can be measured by the same procedure in the subsequent procedure. Further, as for the silica particles contained in the polishing liquid, the silica particles are isolated from the polishing liquid and washed, and the silanol group density can be measured by the same procedure in the subsequent procedure.

The details of the above-described method for calculating the density of the silanol groups are disclosed, for example, in Analytical Chemistry, 1956, vol. 28, No. 12, p.1.981 to 1983, and Japanese Journal of Applied Physics, 2003, Vol. 42, p. 4992 to 4997.

The lower limit of the degree of association (average secondary particle diameter/average primary particle diameter) of the abrasive grains is 1.5 or more from the viewpoint of polishing silicon nitride and polysilicon non-selectively with respect to silicon dioxide. The lower limit of the degree of association of the abrasive grains is preferably 1.7 or more, more preferably 1.9 or more, further preferably 2.0 or more, particularly preferably 2.1 or more, and extremely preferably 2.2 or more, from the viewpoint of easily polishing silicon nitride and polysilicon non-selectively with respect to silicon dioxide. The upper limit of the degree of association of the abrasive grains is preferably 3.0 or less, more preferably 2.5 or less, and further preferably 2.3 or less, from the viewpoint of easily polishing silicon nitride and polysilicon non-selectively with respect to silicon dioxide.

The upper limit of the average primary particle diameter of the abrasive grains is preferably 40 nm or less, more preferably 35 nm or less, and further preferably 30 nm or less, from the viewpoint of easily polishing silicon nitride and polysilicon non-selectively with respect to silicon dioxide. The lower limit of the average primary particle diameter of the abrasive grains is preferably 15 nm or more, more preferably 20 nm or more, and further preferably 25 nm or more, from the viewpoint of easily polishing silicon nitride and polysilicon non-selectively with respect to silicon dioxide.

The "average primary particle diameter" of the abrasive grains refers to an average diameter of particles that can be calculated from the BET specific surface area and the average primary particle diameter is calculated from the adsorption specific surface area (hereinafter, referred to as "BET specific surface area") by a gas adsorption method according to the following Formula (2a).

$$D1=6/(\rho \times V) \quad (2a)$$

[in the formula, D1 represents an average primary particle diameter (unit: $\rho$ represents a density of particles (unit: kg/m$^3$), and V represents a BET specific surface area (unit: m$^2$/g).]

More specifically, the particles are first dried with a vacuum freeze dryer, and then the residue is finely crushed with a mortar (magnetic, 100 ml) to obtain a sample for measurement. Next, a BET specific surface area V of the sample for measurement is measured using a BET specific surface area measuring apparatus (trade name: Autosorb 6) manufactured by YUASA-IONICS Inc. Then, an average primary particle diameter D1 is calculated based on the above Formula (2a).

Incidentally, in the case of the particles being colloidal silica, the density $\rho$ of the particles is "$\rho$=2200 (kg/m$^3$)." In this case, the Formula (2b) described below is Obtained, and by substituting the BET specific surface area V (m$^2$/g) into Formula 2b the average primary particle diameter D1 can be Obtained.

$$D1=2.727 \times 10^{-6}/V(m)=2727/V(nm) \quad (2b)$$

The upper limit of the average secondary particle diameter of the abrasive grains is preferably 80 nm or less, more preferably 75 nm or less, and further preferably 70 nm or less, from the viewpoint of easily polishing silicon nitride and polysilicon non-selectively with respect to silicon dioxide. The lower limit of the average secondary particle diameter of the abrasive grains is preferably 30 nm or more, more preferably 40 nm or more, further preferably 50 nm or more, and particularly preferably 60 nm or more, from the viewpoint of easily polishing silicon nitride and polysilicon non-selectively with respect to silicon dioxide.

The "average secondary particle diameter" of the abrasive grains can be measured by a dynamic light scattering particle size distribution meter (for example, trade name: COULTER N5 type manufactured by COULTER Electronics). The measurement conditions of COULTER include a measurement temperature of 20° C., a solvent refractive index of 1.333 (corresponding to water), a particle refractive index: Unknown (setting), a solvent viscosity of 1.005 mPa·s (corresponding to water), a Run Time of 200 sec, a laser incident angle of 90°, and an intensity (corresponding to a scattering intensity or turbidity) is adjusted to be in a range of 5E+04 to 4E+05, and then measurement is performed. When the intensity is higher than 4E+05, measurement is performed by diluting with water.

The zeta potential of the abrasive grain in the polishing liquid is preferably positive, more preferably +4 mV or more, further preferably +6 mV or more, particularly preferably +8 mV or more, and extremely preferably +10 mV or more, from the viewpoint of easily polishing silicon nitride and polysilicon non-selectively with respect to silicon dioxide. The zeta potential of the abrasive grain in the polishing liquid is preferably +16 mV or less, more preferably +14 mV or less, and further preferably +12 mV or less, from the viewpoint of easily polishing silicon nitride and polysilicon non-selectively with respect to silicon dioxide.

The zeta potential ($\zeta$[mV]) can be measured using a zeta potential measuring apparatus. At this time, the measurement sample is obtained by diluting the polishing liquid with pure water such that the scattering intensity of the measurement sample becomes $1.0 \times 10^4$ to $5.0 \times 10^4$ cps ("cps" means counts per second and is a counting unit for particles). Then, the measurement sample is placed in a cell for measuring the zeta potential, and the zeta potential is measured. In order to adjust the scattering intensity to the above-descried range, for example, the polishing liquid is diluted such that the abrasive grains become 1.7 to 1.8 parts by mass with respect to 100 parts by mass of the polishing liquid.

The lower limit of the content of the abrasive grains is preferably 0.005% by mass or more, more preferably 0.01% by mass or more, further preferably 0.05% by mass or more, particularly preferably 0.10% by mass or more, extremely preferably 0.20% by mass or more, very preferably 0.50% by mass or more, and even more preferably 0.70% by mass or more, based on the total mass of the polishing liquid, from the viewpoint of improving the polishing rate of the material to be polished. The upper limit of the content of the abrasive grains is preferably 20% by mass or less, more preferably 15% by mass or less, further preferably 10% by mass or less, particularly preferably 5.0% by mass or less, extremely preferably 3.0% by mass or less, and very preferably 1.5% by mass or less, based on the total mass of the polishing liquid, from the viewpoint of enhancing the storage stability of the polishing liquid.

(Phosphonic Acid Compound)

The polishing liquid of the present embodiment contains a phosphonic acid compound having a molecular weight of 210 or more. The phosphonic acid compound is a compound having a phosphonic acid group.

The molecular weight of the phosphonic acid compound is preferably 220 or more, more preferably 240 or more, further preferably 260 or more, particularly preferably 270 or more, extremely preferably 280 or more, and very preferably 290 or more, from the viewpoint of easily polishing silicon nitride and polysilicon non-selectively with respect to silicon dioxide. The molecular weight of the phosphonic acid compound is preferably 350 or less, more preferably 320 or less, further preferably 310 or less, and particularly preferably 300 or less, from the viewpoint of easily polishing silicon nitride and polysilicon non-selectively with respect to silicon dioxide.

The number of phosphonic acid groups in the phosphonic acid compound is preferably 1 or more, more preferably 2 or more, and further preferably 3 or more, from the viewpoint of easily polishing silicon nitride and polysilicon non-selectively with respect to silicon dioxide. The number of phosphonic acid groups in the phosphonic acid compound is preferably 6 or less, more preferably 5 or less, and further preferably 4 or less, from the viewpoint of easily polishing silicon nitride and polysilicon non-selectively with respect to silicon dioxide.

From the viewpoint of easily polishing silicon nitride and polysilicon non-selectively with respect to silicon dioxide, the phosphonic acid compound may be a compound containing a nitrogen atom, or it may be a tertiary amine compound.

The phosphonic acid compound may have a carboxyl group from the viewpoint of easily polishing silicon nitride and polysilicon non-selectively with respect to silicon dioxide. In a case where the phosphonic acid compound has a carboxyl group, the number of carboxyl groups is preferably 1 or more, more preferably 2 or more, and further preferably 3 or more. The number of carboxyl groups is preferably 6 or less, more preferably 5 or less, and further preferably 4 or less, from the viewpoint of easily polishing silicon nitride and polysilicon non-selectively with respect to silicon dioxide.

Examples of the phosphonic acid compound include nitrilotrismethylene phosphonic acid, 2-phosphonobutan-1,2,4-tricarboxylic acid, 4-amino-1-hydroxybutan-1,1-diphosphonic acid, benzhydrylphosphonic acid, (4-bromobutyl) phosphonic acid, (4-bromophenyl)phosphonic acid, 1,4-butylenediphosphonic acid, N,N,N',N'-ethylenediaminetetrakis(methylenephosphonic acid), glycine-N,N-bis(methylenephosphonic acid), 1,6-hexylenediphosphonic acid, 1,5-pentylenediphosphonic acid, 1,4-phenylenediphosphonic acid, o-xylylenediphosphonic acid, m-xylenediphosphonic acid, p-xylenediphosphonic acid, and 1-hydroxy-2-(1-imidazolyl)ethane-1,1-diphosphonic acid. As the phosphonic acid compound, from the viewpoint of easily polishing silicon nitride and polysilicon non-selectively with respect to silicon dioxide, at least one selected from the group consisting of nitrilotrismethylene phosphoric acid and 2-phosphonobutan-1,2,4-tricarboxylic acid is preferred, and nitrilotrismethylene phosphonic acid is more preferred.

The lower limit of the content of the phosphonic acid compound is preferably 0.005% by mass or more, more preferably 0.01% by mass or more, further preferably 0.02% by mass or more, particularly preferably 0.03% by mass or more, extremely preferably 0.05% by mass or more, very preferably 0.10% by mass or more, and even more preferably 0.20% by mass or more, based on the total mass of the polishing liquid, from the viewpoint of easily polishing silicon nitride and polysilicon non-selectively with respect to silicon dioxide. The upper limit of the content of the phosphonic acid compound is preferably 10% by mass or less, more preferably 5.0% by mass or less, further preferably 3.0% by mass or less, particularly preferably 1.0% by mass or less, extremely preferably 0.50% by mass or less, and very preferably 0.30% by mass or less, based on the total mass of the polishing liquid, from the viewpoint of easily polishing silicon nitride and polysilicon non-selectively with respect to silicon dioxide.

(Amino Acid Component: Amino Acid and Amino Acid Derivative)

The polishing liquid of the present embodiment contains at least one amino acid component selected from the group consisting of amino acids and amino acid derivatives (excluding a compound corresponding to a phosphonic acid compound). Examples of the amino acid derivatives include amino acid esters, amino acid salts, and peptides. The amino acid is a compound having both functional groups of an amino group and a carboxyl group.

Examples of the amino acid component include α-alanine, β-alanine (also known as 3-aminopropanoic acid), 2-aminobutyric acid, norvaline, valine, leucine, norleucine, isoleucine, alloisoleucine, phenylalanine, proline, sarcosine, ornithine, lysine, serine, threonine, allothreonine, homoserine, tyrosine, 3,5-diiodotyrosine, β-(3,4-dihydroxyphenyl)-alanine, thyroxin, 4-hydroxy-proline, cysteine, methionine, ethionine, lanthionine, cystathionine, cystine, cysteic acid, aspartic acid, glutamic acid, S-(carboxymethyl)-cysteine, 4-aminobutyric acid, asparagine, glutamine, azaserine, arginine, canavanine, citrulline, δ-hydroxy-lysine, creatine, kynurenine, histidine, 1-methyl-histidine, 3-methyl-histidine, ergothioneine, tryptophan, glycylglycine, glycylglycylglycine, vasopressin, oxytocin, kassinin, eledoisin, glucagon, secretin, proopiomelanocortin, enkephalin, and prodymorphin.

Among amino acid components, from the viewpoint of easily polishing silicon nitride and polysilicon non-selectively with respect to silicon dioxide, a low-molecular-weight amino acid is preferred. Specifically, an amino acid having a molecular weight of 300 or less is preferred, an amino acid having a molecular weight of 250 or less is more preferred, and an amino acid having a molecular weight of 200 or less is further preferred. Examples of such an amino acid include α-alanine (molecular weight: 89), β-alanine (molecular weight: 89), serine (molecular weight: 105), histidine (molecular weight: 155), glycylglycine (molecular weight: 132), and glycylglycylglycine (molecular weight: 189).

The lower limit of the content of the amino acid component is preferably 0.005% by mass or more, more preferably 0.01% by mass or more, further preferably 0.02% by mass or more, particularly preferably 0.03% by mass or more, extremely preferably 0.05% by mass or more, very preferably 0.10% by mass or more, and even more preferably 0.20% by mass or more, based on the total mass of the polishing liquid, from the viewpoint of easily polishing silicon nitride and polysilicon non-selectively with respect to silicon dioxide. The upper limit of the content of the amino acid component is preferably 10% by mass or less, more preferably 5.0% by mass or less, further preferably 3.0% by mass or less, particularly preferably 1.0% by mass or less, extremely preferably 0.50% by mass or less, and very preferably 0.30% by mass or less, based on the total mass of the polishing liquid, from the viewpoint of easily polishing silicon nitride and polysilicon non-selectively with respect to silicon dioxide.

(Other Components)

The polishing liquid of the present embodiment may further contain other additives (excluding the phosphoric acid compound and the amino acid compound described above). Examples of the additives include a phosphonic acid compound having a molecular weight of less than 210, a water-soluble polymer, and an oxidizing agent (for example, hydrogen peroxide).

Examples of the water-soluble polymer include polyacrylic acid-based polymers such as polyacrylic acid, a polyacrylic acid copolymer, polyacrylate, and a polyacrylic acid copolymer salt; polymethacrylic acid-based polymers such as polymethacrylic acid and polymethacrylate; polyacrylamide; polydimethylacrylamide; polysaccharides such as alginic acid, pectinic acid, carboxymethylcellulose, agar, curdlan, dextrin, cyclodextrin, and pullulan; vinyl-based polymers such as polyvinyl alcohol, polyvinylpyrrolidone, and polyacrolein; glycerin-based polymers such as polyglycerin and polyglycerin derivatives; and polyethyleneglycol.

The polishing liquid of the present embodiment can contain water. Examples of water include deionized water and ultrapure water. The content of water may be the remainder of the polishing liquid excluding the content of the other constituent components and is not particularly limited.

(pH)

The lower limit of the pH of the polishing liquid of the present embodiment is preferably 1.0 or more, more preferably 1.5 or more, further preferably 2.0 or more, particularly preferably 2.2 or more, extremely preferably 2.4 or more, very preferably 2.5 or more, and even more preferably 2.7 or more, from the viewpoint of easily polishing silicon nitride and polysilicon non-selectively with respect to silicon dioxide. The upper limit of the pH is preferably 6.0 or less, more preferably 5.0 or less, further preferably 4.0 or less, particularly preferably 3.0 or less, and extremely preferably less than 3.0, from the viewpoint of easily polishing silicon nitride and polysilicon non-selectively with respect to silicon dioxide. From the above viewpoints, the pH of the polishing liquid is preferably 1.0 to 6.0 and more preferably 2.0 to 5.0. The pH of the polishing liquid is defined as the pH at a liquid temperature of 25° C.

The pH of the polishing liquid can be adjusted by an acid component such as an inorganic acid or an organic acid; an alkali component such as ammonia, sodium hydroxide, tetramethylammonium hydroxide (TMAH), imidazole, or alkanolamine; and the like. Further, in order to stabilize the pH, a buffer may be added. In addition, a buffer solution (buffer-containing liquid) may be added as the buffer. Examples of such a buffer solution include an acetate buffer solution and a phthalate buffer solution.

The pH of the polishing liquid of the present embodiment can be measured by a pH meter (for example, Model F-51 manufactured by HORIBA, Ltd.). Specifically, for example, the pH is measured by the above-described measuring apparatus by placing an electrode in the polishing liquid after 3-point calibration using standard buffer solution (phthalate pH buffer solution, pH: 4.01; neutral phosphate pH buffer solution, pH: 6.86; borate pH buffer solution, pH: 9.18) and measuring the value upon stabilization after an elapse of 3 minutes or longer. Both the liquid temperatures of the standard buffer solution and the polishing liquid are set to 25° C.

The polishing liquid of the present embodiment may be stored as a one-pack type polishing liquid containing at least abrasive grains, a phosphonic acid compound, and an amino acid component, or may be stored as a multi-pack type (for example, two-pack type) polishing liquid set containing constituent components of the polishing liquid divided into a slurry (first liquid) and an additive liquid (second liquid) such that the shiny and the additive liquid are mixed to form the polishing liquid. The slurry contains, for example, at least abrasive grains and water. The additive liquid contains, for example, at least a phosphonic acid compound, an amino acid component, and water. Incidentally, the constituent components of the polishing liquid may be stored as a polishing liquid set divided into three or more liquids.

In the polishing liquid set, the slurry and the additive liquid are mixed immediately before polishing or during polishing to prepare the polishing liquid. Further, a one-pack type polishing liquid may be stored as a stock solution for a polishing liquid with a reduced liquid medium content and used by dilution with a liquid medium at the time of polishing. A multi-pack type polishing liquid set may be stored as a stock solution for a slurry and a stock solution for an additive liquid with reduced liquid medium contents, and used by dilution with a liquid medium at the time of polishing.

<Polishing Method>

A polishing method of the present embodiment includes a polishing step of polishing a surface to be polished containing silicon dioxide and at least one selected from the group consisting of silicon nitride and polysilicon using the polishing liquid of the present embodiment. For example, the polishing method of the present embodiment includes a polishing step of polishing a surface to be polished containing silicon dioxide, silicon nitride, and polysilicon using the polishing liquid of the present embodiment. As the polishing liquid used in the polishing step, the polishing liquid may be the one-pack type polishing liquid or may be a polishing liquid obtained by mixing a slurry and an additive liquid of the polishing liquid set. In the polishing step, silicon dioxide, silicon nitride, and polysilicon can be simultaneously polished. In this case, it is possible to polish a surface to be polished containing silicon dioxide, silicon nitride, and polysilicon while flattening.

In the polishing step, for example, while a surface to be polished of a base substrate is pressed on a polishing pad (polishing cloth) of a polishing platen, the polishing liquid is supplied between the surface to be polished and the polishing pad, and the base substrate and the polishing platen are relatively moved to polish the surface to be polished. In the polishing step, for example, at least a part of silicon dioxide, silicon nitride, and polysilicon is respectively removed by polishing.

As a base substrate to be polished, a substrate to be polished or the like is exemplified. As the substrate to be polished, for example, a base substrate in which a material to be polished is formed on a substrate for semiconductor production (for example, a semiconductor substrate in which an STI pattern, a gate pattern, a wiring pattern, or the like is formed) is exemplified. Examples of the material to be polished include silicon oxide, silicon nitride, and polysilicon. The material to be polished may be in the form of a film (film to be polished) or may be a silicon oxide film, a silicon nitride film, a polysilicon film, or the like.

In the polishing method of the present embodiment, as a polishing apparatus, it is possible to use a common polishing apparatus which has a holder capable of holding a base substrate having a surface to be polished and a polishing platen to which a polishing pad can be attached. A motor or the like in which the number of rotations can be changed may be attached to each of the holder and the polishing platen. As the polishing apparatus, for example, a polishing apparatus: Reflexion manufactured by Applied Materials, Inc. can be used.

As the polishing pad, common unwoven cloth, a foamed body, an unfoamed body, and the like can be used. As the material of the polishing pad, it is possible to use a resin such as polyurethane, an acrylic resin, polyester, an acrylic-ester copolymer, polytetrafluoroethylene, polypropylene, polyethylene, poly-4-methylpentene, cellulose, cellulose ester, polyamide (for example, Nylon (trade name) and aramid), polyimide, polyimnidamide, a polysiloxane copolymer, an oxirane compound, a phenolic resin, polystyrene, polycarbonate, or an epoxy resin.

The lower limit of the ratio of the polishing rates of silicon nitride and polysilicon with respect to the polishing rate of silicon dioxide is preferably 0.80 or more, more preferably 0.85 or more, further preferably 0.90 or more, and particularly preferably 0.95 or more. The upper limit of the ratio of the polishing rates of silicon nitride and polysilicon with respect to the polishing rate of silicon dioxide is preferably 1.20 or less, more preferably less than 1.20, farther preferably 1.15 or less, particularly preferably 1.10 or less, and extremely preferably 1.05 or less. From the above viewpoints, the ratio is preferably 0.80 to 1.20 and more preferably 0.80 or more and less than 1.20.

EXAMPLES

Hereinafter, the present invention will be described in more detail with reference to examples. However, the present invention is not limited to these examples unless departing from the technical idea of the present invention. For example, the type of materials of the polishing liquid and the blending ratio thereof may be types and ratios other than the types and ratios described in the present examples, and the composition and the structure of the object to be polished may also be compositions and structures other than the compositions and the structures described in the present examples.

<Preparation of Abrasive Grains>

Colloidal silicas A to C having the physical properties shown in Table 1 were prepared.

<Preparation of CMP Polishing Liquid>

Example 1

Additive A (nitrilotrismethylene phosphonic acid, molecular weight: 299.05) and Additive B (glycine) of Table 2 each were put in a container in an amount of 0.20 part by mass. Subsequently, X parts by mass of ultrapure water was poured, and then stirring and mixing were performed to dissolve Additive A and Additive B. Next, colloidal silica A corresponding to 1.0 part by mass as silica particles was added to obtain a CMP polishing liquid of Example 1. Incidentally, X parts by mass of the ultrapure water was calculated and obtained so that the total of the CMP polishing liquid became 100 parts by mass.

Examples 2 to 4 and Comparative Examples 1 to 7

The same operation as in Example 1 was performed using respective components shown in Tables 2 and 3 to obtain CMP polishing liquids of Examples 2 to 4 and Comparative Examples 1 to 7. The molecular weight of 2-phosphonobutane-1,2,4-tricarboxylic acid is 270.13, and the molecular weight of 1-hydroxyethane-1,1-diphosphonic acid is 206.03.

<Evaluation>

(pH of CMP Polishing Liquid)

The pH of the CMP polishing liquid was measured under the following conditions. The results are shown in Tables 2 and 3.

Measurement temperature: 25° C.

Measuring apparatus: Model F-51 manufactured by HORIBA, Ltd.

Measurement method: The pH was measured by the above-described measuring apparatus by placing an electrode in the CMP polishing liquid after 3-point calibration using standard buffer solution (phthalate pH buffer solution, pH: 4.01 (25° C.); neutral phosphate pH buffer solution, pH: 6.86 (25° C.); borate pH buffer solution, pH: 9.18 (25° C.)) and measuring the value upon stabilization after an elapse of 3 minutes or longer.

(Zeta Potential)

The zeta potential of the abrasive grain in the CMP polishing liquid was measured as follows. As a zeta potential measuring apparatus, trade name: DELSA NANO C manufactured bye Beckman Coulter, Inc. was used. A measurement sample was obtained by diluting the CMP polishing liquid with pure water so that the scattering intensity of the measurement sample became $1.0 \times 10^4$ to $5.0 \times 10^4$ cps, in the zeta potential measuring apparatus. Then, the measurement sample was placed in a cell for measuring the zeta potential, and the zeta potential was measured. The results are shown in Tables 2 and 3.

(Polishing Rate)

Three kinds of blanket substrates described below were polished using the obtained CMP polishing liquid under the polishing conditions described below.

[Blanket Substrate]

Blanket substrate having a silicon dioxide film with a thickness of 10000 Å on a silicon substrate Blanket substrate having a silicon nitride film with a thickness of 2500 Å on a silicon substrate Blanket substrate having a polysilicon film with a thickness of 5000 Å on a silicon substrate

[Polishing Conditions]

Polishing apparatus: CMP polishing machine Reflexion LK (manufactured by APPLIED MAMMALS)

Polishing pad: polyurethane pad Fujibo H800 (manufactured by Fujibo Holdings, Inc.)

Polishing pressure: 10 kPa

Number of revolutions of platen: 93 rpm

Number of revolutions of head: 87 rpm

Amount of CMP polishing liquid to be supplied: 300 ml/min

Polishing time: 60 seconds

[Calculation of Polishing Rate and Polishing Selection Ratio]

The film thicknesses of films to be polished (the silicon dioxide film, the silicon nitride film, and the polysilicon film) before and after polishing were measured using a light interference type film thickness measuring apparatus (apparatus name: F80) manufactured by Filmetrics Japan, Inc. and then a change amount in film thickness was calculated. 79 film thicknesses were measured, and a change amount in film thickness was calculated using an average film thickness value. The polishing rate of the film to be polished was calculated by the following formula based on the change amount in film thickness and the polishing time. The results are shown in Tables 2 and 3.

Polishing rate[Å/min]=(Film thickness before polishing [Å]−Film thickness after polishing[Å])/Polishing time[min]

Further, the polishing selection ratios of silicon nitride and polysilicon when the polishing rate of silicon dioxide was set to 1.00 were calculated. The results are shown in Tables 2 and 3.

TABLE 1

| Physical properties of abrasive grains | Unit | Colloidal silica A | Colloidal silica B | Colloidal silica C |
|---|---|---|---|---|
| Silanol group density | groups/nm$^2$ | 1.6 | 4.3 | 7.0 |
| Average secondary particle diameter | nm | 62 | 60 | 59 |
| Average primary particle diameter | nm | 28 | 46 | 33 |
| Degree of association | — | 2.2 | 1.3 | 1.8 |

TABLE 2

| | Items | Example 1 | Example 2 | Example 3 | Example 4 |
|---|---|---|---|---|---|
| Abrasive grains | Colloidal silica A | 1.0 | 1.0 | 1.0 | 1.0 |
| | Colloidal silica B | — | — | — | — |
| | Colloidal silica C | — | — | — | — |
| Additive A | Nitrilotrismethylene phosphonic acid | 0.20 | — | 0.20 | — |
| | 2-Phosphonobutane-1,2,4-tricarboxylic acid | — | 0.20 | — | 0.20 |
| | 1-Hydroxyethane-1,1-diphosphonic acid | — | — | — | — |
| | Acetic acid | — | — | — | — |
| | Malic acid | — | — | — | — |
| Additive B | Glycine | 0.20 | 0.20 | — | — |
| | Alanine | — | — | 0.20 | 0.20 |
| | pH | 2.5 | 2.5 | 2.5 | 2.5 |
| | Zeta potential [mV] | +10 | +10 | +10 | +10 |
| Polishing rate (Å/min) | Silicon dioxide | 285 | 351 | 290 | 356 |
| | Silicon nitride | 300 | 302 | 286 | 316 |
| | Polysilicon | 284 | 405 | 277 | 398 |
| Polishing selection ratio | Silicon dioxide | 1.00 | 1.00 | 1.00 | 1.00 |
| | Silicon nitride | 1.05 | 0.86 | 0.99 | 0.89 |
| | Polysilicon | 1.00 | 1.15 | 0.96 | 1.12 |

TABLE 3

| | Items | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|
| Abrasive grains | Colloidal silica A | — | — | 1.0 | 1.0 | 1.0 | 1.0 | 1.0 |
| | Colloidal silica B | 1.0 | — | — | — | — | — | — |
| | Colloidal silica C | — | 1.0 | — | — | — | — | — |
| Additive A | Nitrilotrismethylene phosphonic acid | 0.20 | 0.20 | — | — | — | 0.20 | — |
| | 2-Phosphonobutane-1,2,4-tricarboxylic acid | — | — | — | — | — | — | — |
| | 1-Hydroxyethane-1,1-diphosphonic acid | — | — | 0.20 | — | — | — | — |
| | Acetic acid | — | — | — | 0.40 | — | — | — |
| | Malic acid | — | — | — | — | 0.20 | — | — |
| Additive B | Glycine | 0.20 | 0.20 | 0.20 | — | — | — | 0.20 |
| | Alanine | — | — | — | — | — | — | — |
| | pH | 2.5 | 2.5 | 2.5 | 3.0 | 2.5 | 2.0 | 6.0 |
| | Zeta potential [mV] | +8 | +5 | +10 | +8 | +10 | +10 | −30 |
| Polishing rate (Å/min) | Silicon dioxide | 430 | 350 | 325 | 870 | 870 | 610 | 137 |
| | Silicon nitride | 60 | 170 | 452 | 397 | 247 | 440 | 56 |
| | Polysilicon | 350 | 90 | 725 | 508 | 261 | 255 | 39 |
| Polishing selection ratio | Silicon dioxide | 1.00 | 1.00 | 1.00 | 1.00 | 1.00 | 1.00 | 1.00 |
| | Silicon nitride | 0.14 | 0.49 | 1.39 | 0.46 | 0.28 | 0.72 | 0.41 |
| | Polysilicon | 0.81 | 0.26 | 2.23 | 0.58 | 0.30 | 0.42 | 0.28 |

In Examples, it is found that the polishing rates of silicon nitride and polysilicon are 0.80 to 1.20 when the polishing rate of silicon dioxide is set to 1.00, and silicon nitride and polysilicon can be polished non-selectively with respect to silicon dioxide.

In Comparative Example 1 in which the degree of association of the abrasive grains is small, it is found that silicon nitride cannot be polished non-selectively with respect to silicon dioxide. In Comparative Example 2 in which the silanol group density of the abrasive grains is large, it is found that silicon nitride and polysilicon cannot be polished non-selectively with respect to silicon dioxide. In Comparative Examples 3 to 7 in which at least one of the phosphonic acid compound and the amino acid component is not used, it is found that silicon nitride and polysilicon cannot be polished non-selectively with respect to silicon dioxide.

The invention claimed is:

1. A polishing liquid comprising:
   abrasive grains;
   a phosphonic acid compound having a molecular weight of 210 or more; and
   at least one selected from the group consisting of amino acids and amino acid derivatives, wherein
   a silanol group density of the abrasive grains is 6.5 groups/nm$^2$ or less,
   a degree of association of the abrasive grains is 2.2 or more,
   a pH is 6.0 or less, and
   the polishing liquid has a property that, when used for polishing surfaces of silicon nitride and silicon dioxide, a ratio of polishing rate of silicon nitride with respect to a polishing rate of silicon dioxide is in a range of 0.80 to 1.20.

2. The polishing liquid according to claim 1, wherein the abrasive grains contain colloidal silica.

3. The polishing liquid according to claim 1, wherein a zeta potential of the abrasive grain is positive.

4. The polishing liquid according to claim 1, wherein a pH is 2.0 to 5.0.

5. The polishing liquid according to claim 1, wherein the polishing liquid is configured to be used for polishing a surface to be polished containing silicon dioxide, silicon nitride, and polysilicon.

6. The polishing liquid according to claim 1, wherein the polishing liquid has a property that, when used for polishing surfaces of polysilicon and silicon dioxide, a ratio of polishing rate of polysilicon with respect to a polishing rate of silicon dioxide is in a range of 0.80 to 1.20.

7. The polishing liquid according to claim 6, wherein a content of the abrasive grains is less than 3.0% by mass based on the total mass of the polishing liquid.

8. The polishing liquid according to claim 6, wherein the phosphonic acid compound contains 2-phosphonobutan-1,2,4-tricarboxylic acid.

9. The polishing liquid according to claim 1, wherein the polishing liquid has a property that, when used for polishing surfaces of silicon nitride, polysilicon and silicon dioxide, a ratio of polishing rates of silicon nitride and polysilicon with respect to a polishing rate of silicon dioxide is 0.80 or more and less than 1.20.

10. The polishing liquid according to claim 1, wherein a content of the abrasive grains is less than 3.0% by mass based on the total mass of the polishing liquid.

11. The polishing liquid according to claim 1, wherein the phosphonic acid compound contains 2-phosphonobutan-1,2,4-tricarboxylic acid.

12. A polishing method comprising a step of polishing a surface to be polished containing silicon dioxide, silicon nitride, and polysilicon using the polishing liquid according to claim 1.

* * * * *